United States Patent [19]

Koike et al.

[11] 4,256,520

[45] Mar. 17, 1981

[54] ETCHING OF GALLIUM STAINS IN LIQUID PHASE EPITOXY

[75] Inventors: Susumu Koike, Kawachinagano; Toshio Matsuda, Ohtsu; Hitoo Iwasa, Ibaraki, all of Japan

[73] Assignee: Matsushita Electric Industrial Co., Ltd., Kodama, Japan

[21] Appl. No.: 105,861

[22] Filed: Dec. 20, 1979

[30] Foreign Application Priority Data

Dec. 26, 1978 [JP] Japan .................. 53-165724

[51] Int. Cl.³ .................. H01L 21/208; H01L 21/306
[52] U.S. Cl. .................. 148/171; 148/1.5; 148/172; 156/662; 252/79.2
[58] Field of Search .................. 156/662; 148/171, 172, 148/1.5; 252/79.2

[56] References Cited

U.S. PATENT DOCUMENTS

| | | | |
|---|---|---|---|
| 2,871,110 | 1/1959 | Stead | 156/662 X |
| 2,973,253 | 2/1961 | Stead | 156/662 |
| 3,639,975 | 2/1972 | Tefft | 156/662 X |
| 3,679,501 | 7/1972 | Chicotkg | 156/662 |
| 3,697,318 | 10/1972 | Feinberg et al. | 156/662 X |
| 3,767,494 | 10/1973 | Muraoka et al. | 148/1.5 X |
| 3,890,169 | 6/1975 | Schwartz et al. | 148/1.5 X |
| 3,892,606 | 7/1975 | Chappelow et al. | 156/662 X |
| 3,978,428 | 8/1976 | Burnham et al. | 148/171 X |
| 4,100,014 | 7/1978 | Kuh-Kuhnenfeld et al. | 156/662 X |
| 4,108,715 | 8/1978 | Ishikawa et al. | 156/662 X |

*Primary Examiner*—G. Ozaki
*Attorney, Agent, or Firm*—Cushman, Darby & Cushman

[57] ABSTRACT

A method of treating semiconductor substrate comprising the step of after epitaxial growth of III–V compound semiconductor layers on a substrate by a liquid phase epitaxial growth method using gallium as solvent, the substrate is treated by an etchant comprising phosphoric acid, acetic acid and nitric acid thereby selectively removing residue stains of gallium on the surface of the substrate.

6 Claims, 2 Drawing Figures

ETCHING OF GALLIUM STAINS IN LIQUID PHASE EPITOXY

BACKGROUND

1. Field of the Invention

The present invention relates to an improvement of method of treating a semiconductor substrate.

More particularly, the present invention concerns an improvement of method of removing gallium residues or stains remaining on a semiconductor substrate having epitaxial growth layers of III-V compound semiconductors formed by using gallium as a solvent.

2. Prior Art

In forming epitaxial growth layer of gallium arsenide (GaAs), gallium phosphide (GaP) or gallium aluminum arsenide (GaAlAs) on a compound semiconductor substrate, a liquid phase epitaxial growth method using gallium as a solvent is being widely used. Therefore, the liquid phase epitaxial growth method is an indispensable process in manufacturing semiconductor lasers or light emitting diodes. The substrate 1, as shown in FIG. 1 necessarily have residues 2 of small lump of gallium, which are residues of the gallium as the solvent. After the epitaxial growth process, the residue stains 2 of gallium are, large or small, formed on the substrate.

Such small residue stains of the gallium are, not only no more necessary after completion of the epitaxial growth process, but also harmful for the process thereafter. Hitherto, generally, such residue stains of gallium on the substrate have been wiped off by a small ball of surgical cotton soaked with a hot water. However, such wiping off or mechanical removing is liable to form scratches or breaking of the substrate, and use of such semiconductor substrates in manufacturing semiconductor device necessarily makes devices of poor performance characteristics or of no use. When such residue stains of gallium are of a large lump, they will be easily wiped away. However, when the residue stains are very fine, a complete wiping of them will be difficult. Such residue stains of gallium will react with the electrode metal, and hence will deteriorate accuracy of the etching of the electrode metal.

A proposal of a chemical removing of the stains of the gallium retained after the mechanical wipe away, therein the removing being made by immersing the substrate into a heated chloric acid (HCl), has been already proposed. However, because the chloric acid has a nature to etch the III—V compounds, the epitaxial growth layers have been undesirably etched, and the surfaces thereof have become rough.

Thus, hitherto, no method of selectively removing the gallium residues or stains from the surface of the semiconductor substrate has been known.

SUMMARY OF THE INVENTION

The present invention is made to solve the problems in the conventional method for removing gallium residues or stains on a semiconductor substrate having epitaxial growth layers of III—V compound semiconductors formed by using gallium as solvent.

The method of the present invention can completely remove residue stains of gallium out of the surface of the III—V compound semiconductor substrate without scratching, roughening the surface of the epitaxial growth layer or breaking the substrate.

DESCRIPTION OF THE PREFERRED EMBODIMENT

The method of treating semiconductor substrate in accordance with the present invention comprises the step of after epitaxial growth of III—V compound semiconductor layers on a substrate by using gallium as solvent, the substrate is treated by an etchant comprising phosphoric acid, acetic acid and nitric acid thereby selectively removing residue stains of gallium on the surface of the substrate.

A preferred embodiment in accordance with the present invention applied to a gallium phosphide (GaP) is elucidated hereafter.

A treating solution or etchant is prepared by blending the following:

phosphoric acid (98% concentration) . . . 5 parts in volume acetic acid (glacial acetic acid) . . . 4 parts in volume nitric acid (specific gravity: 1.38) . . . 1 part in volume.

A GaP substrate on which GaP epitaxial growth layers have been formed is treated by immersing in the abovementioned etchant, which is kept at room temperature. Then residue stains on surfaces of the substrate actively react with the etchant and is removed within a few minutes when the residue stains of gallium is of very fine ones. Even when the residue stains of gallium has a considerable size, the stains are almost entirely removed within about 30 minutes. In the treatment, though the GaP epitaxial growth layers contacts the etchant, the layers hardly reacts with the etchant and hence the surface of the epitaxial growth layers are not roughened.

Figure 1:
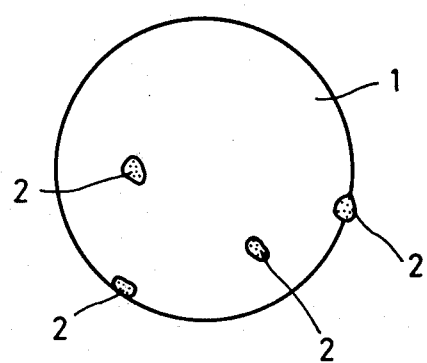
FIG. 1 is a plan view of the semiconductor substrate having stains of gallium residues.
Figure 2:
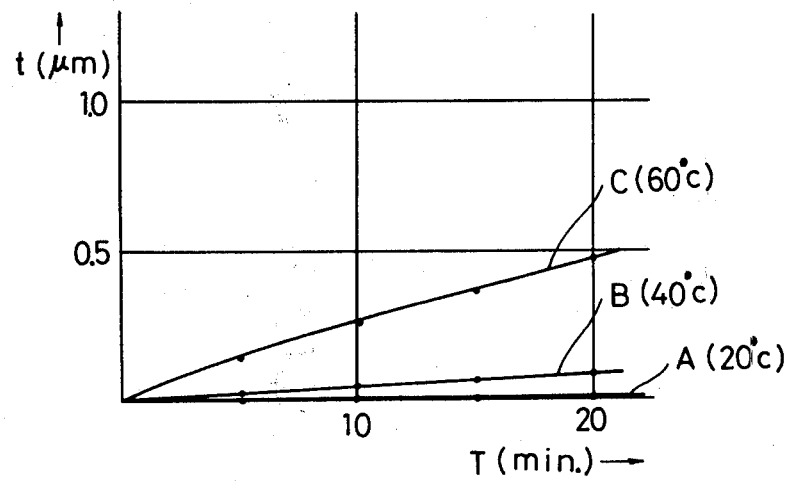
FIG. 2 is a graph showing etching rate, and the parameter is the temperature of the etchant.

FIG. 2 shows relations between etching time (in minutes) and thickness which is etched (in $\mu$m), wherein parameter of the curves is temperature of the etchant. Curve A is for 20° C., curve B is for 40° C. and curve C is for 60° C. of the etchant temperature. As shown by FIG. 2, when the etchant temperature is 20° C. the rate of the etching is substantially zero. When the etchant is at 60° C., by immersing the substrate for 20 minutes in the etchant, the surface of the substrate is etched by a thickness of about 0.5 $\mu$m thereby forming roughened surface. When amount of residue stains of gallium is relatively large, as aforementioned, an etching for about 30 minutes is necessary. For such long time etching, the etchant temperature should be kept under 60° C. in order not to form the abovementioned roughened surface. The etching rate for gallium by the same etchant of 20° C. was 100 $\mu$m/5 minutes, contrasted to almost 0 $\mu$m for GaP. The etching rate for gallium by the same etchant of 40° C. was 400 $\mu$m/5 minutes, contrasted to 0.02 $\mu$m for GaP.

The inventors made many experiments to find possible ranges of the components acids, and found that in the following blending ratio ranges suitable selection of treating time is possible for obtaining reproducible performance of treatment for removal of residues of gallium on a semiconductor substrate:

phosphoric acid (98% concentration) . . . 6 to 4 parts in volume acetic acid (glacial acetic acid) . . . 5 to 2 parts in volume nitric acid (specific gravity: 1.38) . . . 3 to 0.1 parts in volume.

Experiments show that the blending ratio can be expressed in the following mol ratios:

phosphoric acid . . . 6 to 4
acetic acid . . . 4.8 to 1.9
nitric acid . . . 3.6 to 0.12

The abovementioned nitric acid acts as oxidizing agent, and for a value below the abovementioned ranges the removing of gallium is not sufficient, and for a value above the abovementioned ranges the semiconductor substrate is undesirably etched and its surface is roughened.

The phosphoric acid which acts to dissolve the gallium oxidized by the nitric acid, and the amount in the abovementioned range in relation to the nitric acid is found suitable for cooperative function of oxidizing by nitric acid and subsequent dissolving by phosphoric acid of gallium.

The acetic acid functions as a buffer agent.

As is elucidated in the foregoing descriptions, the method of treating the semiconductor substrate in accordance with the present invention can make substantially complete removing of residue stains of gallium on the semiconductor substrate having, for example, liquid phase epitaxial growth layers, and the treatment made no adverse effect on the substrate. Therefore, elimination of adverse effect by the residue stains of gallium can be assured.

The inventors' experiments show that the treating method in accordance with the present invention is equally applicable to semiconductor substrates having epitaxial growth layers of GaAlP, GaInP, GaAsP, GaAs or GaAlAs, etc . . . made by liquid phase epitaxial growth method using gallium as solvent.

What is claimed is:

1. A method of treating semiconductor substrate comprising the step of epitaxially growing III-V compound semiconductor layers on a substrate by a liquid phase epitaxial growth method using gallium as solvent, and then, said substrate with said epitaxially grown layers is treated by an etchant comprising phosphoric acid, acetic acid and nitric acid thereby selectively removing residue stains of gallium on the surface of the substrate.

2. A method of treating semiconductor substrate in accordance with claim 1, wherein said etchant has the contents of the following mol ratio:

phosphoric acid . . . 6 to 4
acetic acid . . . 4.8 to 1.9
nitric acid . . . 3.6 to 0.1

3. A method of treating semiconductor substrate in accordance with claim 2, wherein said etchant is kept at a temperature under 60° C.

4. A method of treating semiconductor substrate in accordance with claim 1, wherein said etchant is kept at a temperature under 60° C.

5. A method of treating semiconductor substrate in accordance with claim 1, wherein said etchant has the following contents:

phosphoric acid (98% concentration) . . . 6 to 4 parts in volume acetic acid (glacial acetic acid) . . . 5 to 2 parts in volume nitric acid (1.38 specific gravity) . . . 3 to 0.1 parts in volume 6. A method of treating semiconductor substrate in accordance with claim 5, wherein said etchant is kept at a temperature under 60° C.

* * * * *